United States Patent
Oda

(10) Patent No.: US 8,127,439 B2
(45) Date of Patent: Mar. 6, 2012

(54) METHOD OF MANUFACTURING ELECTRONIC COMPONENT DEVICE

(75) Inventor: Takuya Oda, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/782,132

(22) Filed: May 18, 2010

(65) Prior Publication Data
US 2010/0299918 A1 Dec. 2, 2010

(30) Foreign Application Priority Data
May 29, 2009 (JP) ................................ 2009-129916

(51) Int. Cl.
*H05K 3/30* (2006.01)

(52) U.S. Cl. ............ 29/832; 29/840; 174/16.3; 361/717

(58) Field of Classification Search ..................... 29/825, 29/832, 840; 174/16.5, 16.3; 361/717; 427/447.3
See application file for complete search history.

(56) References Cited

U.S. PATENT DOCUMENTS 5,098,864 A * 3/1992 Mahulikar ...................... 29/837
5,396,403 A * 3/1995 Patel ............................ 361/705
(Continued)

FOREIGN PATENT DOCUMENTS
JP  2003-264261 A1  9/2003

*Primary Examiner* — Carl Arbes
(74) *Attorney, Agent, or Firm* — Kratz, Quintos & Hanson, LLP

(57) ABSTRACT

A recessed portion is formed in a predetermined position in a heat-spreading component. A thermoplastic resin serving as a thermal interface material (TIM) is stored in the recessed portion. Meanwhile, a large number of filamentous thermo-conductive elements serving as the TIM are arranged to stand side by side on a surface of the heat-spreading component in which the recessed portion is formed (or on an exposed surface of an electronic component). Then, the heat-spreading component is fixed onto a board in such a manner that the surface of the heat-spreading component in which the recessed portion is formed faces the board and that a clearance is adjusted between the electronic component and the heat-spreading component. Thereafter, the resin is heated to a softening point thereof into a fluidized state, and the resin is flowed and filled into the clearance between the electronic component and the heat-spreading component.

4 Claims, 5 Drawing Sheets

U.S. PATENT DOCUMENTS

| | | | | |
|---|---|---|---|---|
| 5,471,366 A | * | 11/1995 | Ozawa | 361/704 |
| 5,710,733 A | * | 1/1998 | Chengson et al. | 365/52 |
| 5,780,101 A | * | 7/1998 | Nolan et al. | 427/216 |
| 5,965,267 A | * | 10/1999 | Nolan et al. | 428/408 |
| 6,212,074 B1 | * | 4/2001 | Gonsalves et al. | 361/717 |
| 6,275,381 B1 | * | 8/2001 | Edwards et al. | 361/717 |
| 6,496,373 B1 | * | 12/2002 | Chung | 361/705 |
| 7,041,535 B2 | * | 5/2006 | Yamashita et al. | 438/122 |

* cited by examiner

METHOD OF MANUFACTURING ELECTRONIC COMPONENT DEVICE

CROSS-REFERENCE TO RELATED APPLICATIONS

This application is based on and claims priority of Japanese Patent Application No. 2009-129916 filed on May 29, 2009, the entire contents of which are incorporated herein by reference.

BACKGROUND OF THE INVENTION (a) Field of the Invention

The present invention relates to a method of manufacturing an electronic component device. More specifically, it relates to a method of manufacturing an electronic component device including an electronic component such as a semiconductor element mounted on a board, and a heat-spreading component which dissipates to the air, heat generated from the electronic component, and which is coupled via a thermal interface material to the electronic component.

(b) Description of the Related Art

A semiconductor element (chip) used in a microprocessor unit (MPU) and the like is electrically connected to and fixed on a wiring board (package) (for example, by flip chip mounting). The semiconductor element is brought to a high temperature state during its operation. Accordingly, unless the semiconductor element is forced to be cooled down, the semiconductor element cannot demonstrate its intended performance, or may be broken down in some cases.

For this reason, a heat-spreading component (for example, a heat spreader made of metal) for dissipating heat generated from a semiconductor element, to the air, is disposed on the semiconductor element. The heat-spreading component ensures a passage through which heat generated from the semiconductor element is dissipated to the outside. In this situation, the semiconductor element is thermally coupled to the heat spreader with a material called a thermal interface material (TIM) interposed therebetween. Specifically, the TIM interposed therebetween fills asperities of both the semiconductor element and the heat spreader to reduce the thermal contact resistance therebetween, and thus heat is smoothly transferred from the semiconductor element to the heat spreader.

Examples of such a thermal interface material (TIM) include one obtained by forming a high thermo-conductive substance, such as indium, silicone (or hydrocarbon) grease, metal filler, graphite or the like, into a sheet shape with a resin binder. In the case of indium, an indium sheet is sandwiched between a heat spreader and a semiconductor element. Then, using a resin material which is cured at the melting point of indium or lower, the heat spreader is temporarily fixed to a package on which the semiconductor element is mounted. Thereafter, reflowing is performed on the assembly at the melting point of indium or higher. While the thickness of indium is controlled, the heat spreader is fixedly bonded to the semiconductor element.

In this process, where the thickness of indium (TIM) is too thick, the TIM has a high thermal resistance. On the contrary, where the thickness is too thin, the TIM cannot flexibly follow a deformation of the semiconductor element occurring due to the heat (warpage of the semiconductor element occurring due to the heat generated during the operation), and accordingly cannot demonstrate its properties sufficiently.

Moreover, indium is relatively expensive, and is a rare metal. Accordingly, the stable supply of future is concerned.

Furthermore, since heat treatment is necessary in the reflowing and the like, there is also another concern in quality that a void is produced during the reflowing in addition to the problem of the complicated manufacturing steps by the reflowing.

For this reason, development of an alternative TIM has been desired. Such a TIM is desired to have stable properties and a high thermal conductivity equivalent to or higher than that of indium. As one of the alternative TIMs, development of a TIM using carbon nanotubes is in progress. This is a method in which carbon nanotubes are arranged in a direction of heat conduction and formed into a sheet shape with a resin. The carbon nanotubes arranged in the direction of heat conduction are fixed within the resin, and tip ends of the carbon nanotubes are in contact with a heat spreader and a semiconductor element. The carbon nanotubes are excellent in thermal conductivity and very high in bending strength (i.e., having an elasticity like a spring). Accordingly, the carbon nanotubes are expected to be capable of following a deformation (warpage) of the semiconductor element by the heat as described above.

An example of a technique related to the above-mentioned prior art is described in Japanese unexamined Patent Publication (Kokai) 2003-264261. This document discloses a thermal coupling sheet interposed between a heat-spreading fin and a heat-spreading plate serving as a cooling surface of a power semiconductor module. The thermal coupling sheet is made of a resin and the heat transferability is increased by a filler mixed therewith. As the resin constituting the thermal coupling sheet, used is a hot-melt resin which melts at a temperature at the time when heat is generated by feeding a current through the power semiconductor module.

In the prior art as mentioned above, the thermal interface material (TIM) using carbon nanotubes is progressively developed as the TIM interposed between an electronic component (semiconductor element) and a heat-spreading component (heat spreader). The carbon nanotubes have a high thermal conductivity equivalent to or higher than that of indium, and also have a very high bending strength. However, this method poses the problems such as described below, because the carbon nanotubes arranged in the direction of heat conduction are fixed within the resin and the tip ends thereof are in contact with the heat spreader and the like.

Specifically, the tip ends of the carbon nanotubes do not always surely come into contact with the surfaces of the heat spreader and the like, depending on the amount of the resin filled between the semiconductor element and the heat spreader, and/or the amount of pressing performed together with heating when the heat spreader is fixed to a package (on which the semiconductor element is mounted). If the tip ends of the carbon nanotubes are not in contact with the surfaces of the heat spreader and the like, the resin is then present in the non-contacting portion, and the thermal resistance in this portion is significantly increased. On the other hand, if the amount of pressing is increased and the carbon nanotubes are excessively pressed, the carbon nanotubes are laid down. As a result, the bending strength (elasticity) which the carbon nanotubes originally have cannot be fully utilized, and thus the carbon nanotubes may not flexibly follow a warpage (deformation) occurring during the heat generation by the semiconductor element.

FIGS. 5A and 5B schematically show such a state. As shown in FIG. 5A, carbon nanotubes 1 arranged in a direction of heat conduction (vertically in the illustrated example) are fixed within a resin layer 2. The carbon nanotubes 1 differ in length from one another. Meanwhile, a surface (lower surface in the illustrated example) of a heat spreader 3 with which the tip ends of the carbon nanotubes 1 are to come into contact has a microscopic asperity as illustrated. The degree of the asperity is small relative to the variation in length among the carbon nanotubes 1. For this reason, the tip ends of shorter carbon nanotubes 1 cannot reach the surface of the heat spreader 3, and the resin layer 2 is present in portions denoted by reference numeral 4 and surrounded by broken lines in the drawing. Accordingly, the thermal resistance in the portions is relatively increased. Moreover, even a carbon nanotube 1 which has a length enough to reach the heat spreader 3 is likely to have an extremely thin resin layer 2 interposed between the tip end thereof and the surface of the heat spreader 3.

In this manner, where the resin layer 2 is present between the tip end of the carbon nanotube 1 and the surface of the heat spreader 3, the thermal resistance in the portion is increased. As a result, the high thermal conductivity of the carbon nanotube 1 cannot be fully utilized. This leads to a problem in that the thermal conductivity between a semiconductor element and the heat spreader 3 is lowered.

On the other hand, where the amount of pressing is increased and the carbon nanotubes 1 are excessively pressed when fixed to the heat spreader 3, the carbon nanotubes 1 are laid down as shown in FIG. 5B. Consequently, it is highly likely that the elasticity (in this case, characteristic to recover to the original vertical arrangement) of the carbon nanotubes 1 is not fully utilized. In this case, the carbon nanotubes 1 cannot follow a deformation (warpage) of the semiconductor element occurring due to the heat generation. In this case too, the extremely thin resin layer 2 is highly likely to be interposed between the tip ends of the carbon nanotubes 1 and the surface of the heat spreader 3.

SUMMARY OF THE INVENTION

An object of the present invention is to provide a method of manufacturing an electronic component device, which is capable of: ensuring a favorable thermal conductivity of a TIM interposed between an electronic component and a heat-spreading component, and canceling a deformation occurring due to heat during the operation of the electronic component, thus contributing to a stable thermal coupling.

According to the invention, there is provided a method of manufacturing an electronic component device which includes an electronic component mounted on a wiring board, and a heat-spreading component having a plate-shaped principal part and being coupled via a thermal interface material to the electronic component, the method including: forming a recessed portion, in the plate-shaped part of the heat-spreading component, at a position on a periphery of a portion thereof corresponding to an area for the electronic component, and storing a thermoplastic resin serving as the thermal interface material in the recessed portion; arranging a large number of filamentous thermo-conductive elements serving as the thermal interface material, so as to stand side by side on a surface of the heat-spreading component in which the recessed portion is formed, or on an exposed surface of the electronic component; fixing the heat-spreading component to the wiring board in such a manner that a surface of the wiring board on which the electronic component is mounted is faced to the surface of the heat-spreading component in which the recessed portion is formed, and that a clearance is adjusted between the electronic component and the heat-spreading component; and heating the thermoplastic resin to a softening point thereof into a fluidized state, and causing the resin to flow into the clearance between the electronic component and the heat-spreading component to thereby fill the clearance.

In the method of manufacturing an electronic component device according to the present invention, the heat-spreading component (for example, heat spreader) is fixed to the wiring board (on which the electronic component (for example, semiconductor element) is mounted) with an appropriate clearance kept between the electronic component and the heat-spreading component. Then, heating to the softening point is performed on the thermoplastic resin (thermal interface material) stored in the recessed portion provided in a predetermined position in the heat-spreading component. Subsequently, the resin melted by the heating is flowed into the clearance between the heat-spreading component and the electronic component to thereby fill clearances among the filamentous thermo-conductive elements (for example, carbon nanotubes) arranged side by side on the surface of the heat-spreading component in which the recessed portion is formed, or arranged on the electronic component.

In this manner, according to the present invention, an appropriate clearance is secured between the electronic component and the heat-spreading component, and then the thermal interface material (thermoplastic resin) is filled into the clearance. Accordingly, when the resin is filled thereinto, the contact state between the tip ends of the filamentous thermo-conductive elements and the surface of the heat-spreading component or the electronic component is ensured. This enables eliminating a problem such as encountered in the prior art (i.e., the resin layer is interposed between the tip ends of the filamentous thermo-conductive elements and the surface of the heat-spreading component, increasing the thermal resistance in the portion). Thus, the favorable thermal conductivity of the thermal interface material (TIM) is ensured between the electronic component and the heat-spreading component.

Moreover, after an appropriate clearance is secured between the electronic component and the heat-spreading component, the thermal interface material (thermoplastic resin) is filled in the clearance. Accordingly, it is no longer necessary to perform a pressing treatment such as performed in the prior art during fixation of the heat-spreading component. Thus, the problem such as exemplified in FIG. 5B (i.e., the filamentous thermo-conductive elements lie down and may not be recovered to the original arrangement) does not occur. In this manner, the TIM is capable of flexibly following a deformation (warpage) occurring due to heat generated when the electronic component is in operation. This contributes to a stable thermal coupling between the electronic component and the heat-spreading component.

DESCRIPTION OF THE PREFERRED EMBODIMENTS

Description is given below with regard to preferred embodiments of the present invention with reference to the accompanying drawings.

Figure 1A:
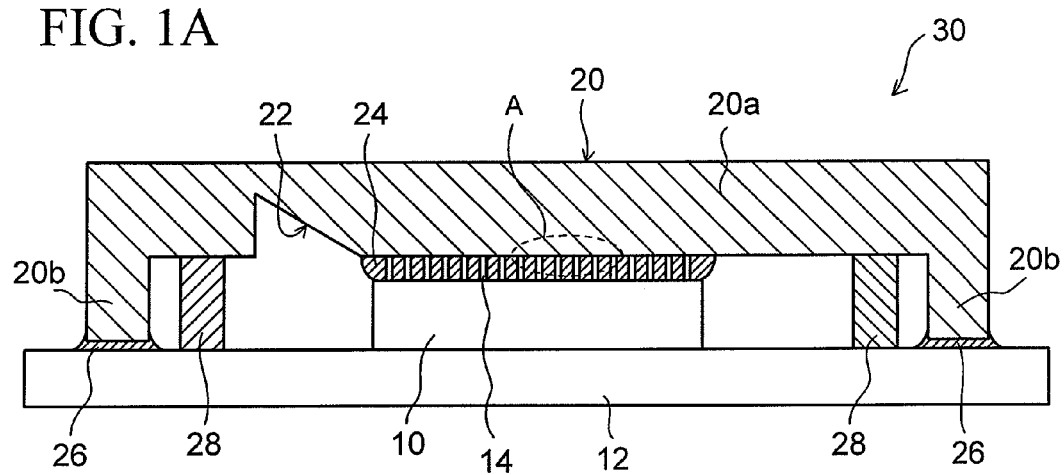
FIGS. 1A and 1B show the configuration of a semiconductor device (electronic component device) using a thermal interface material (TIM) according to an embodiment of the present invention, FIG. 1A being a sectional view thereof, and FIG. 1B being an enlarged sectional view of the part A in FIG. 1A.
Figure 1B:
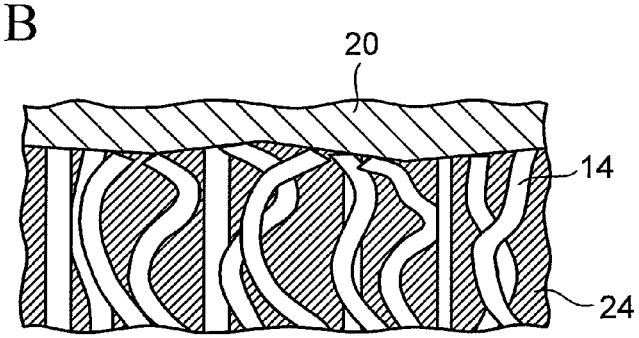

FIGS. 1A and 1B show the configuration of a semiconductor device (electronic component device) using a thermal interface material according to an embodiment of the present invention. FIG. 1A shows a sectional structure thereof, and FIG. 1B shows an enlarged sectional structure of the part A in FIG. 1A.

In a semiconductor device 30 of this embodiment, reference numeral 10 denotes a semiconductor element (chip) serving as an electronic component from which heat should be released. The semiconductor element (chip) 10 is mounted on a wiring board (package) 12 with a face surface (the surface on the side where circuits are formed) of the chip 10 facing downward. Although the specific illustration of a connection portion between the wiring board 12 and the chip 10 is omitted, the configuration of this portion is the same as a normal configuration in which a chip is flip-chip bonded to a package. For example, when a resin board (plastic package) is used as the wiring board 12, electrode terminals of the silicon chip 10 are electrically connected to pads (i.e., parts which are defined at desired positions of a wiring layer covered with the outermost insulating layer (solder resist layer) of the resin board and which are exposed from the solder resist layer) of the resin board with solder bumps or the like interposed therebetween (flip chip mounting). Moreover, an under-fill resin (thermosetting epoxy resin or the like) is filled in a clearance between the mounted chip 10 and the package 12, and thermally cured to mechanically bond the two.

A large number of carbon nanotubes 14 are provided on a surface (the exposed surface) on the opposite side of the semiconductor element (chip) 10 to the face surface. The carbon nanotubes 14 are arranged side by side to stand in a direction of heat conduction (i.e., vertically in the illustrated example) and function as a thermal interface material (TIM). Such carbon nanotubes 14 can be grown on a substrate by adopting a CVD method or the like. In this embodiment, the carbon nanotubes 14 are grown on a heat spreader 20 described below.

Figure 2A:
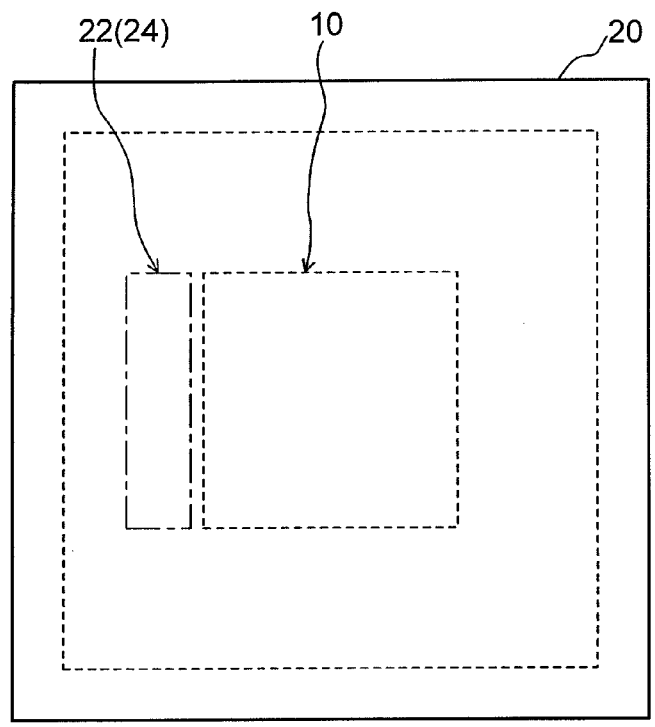
FIGS. 2A and 2B show a manufacturing step of the semiconductor device in FIGS. 1A and 1B, FIG. 2A being a top view of a heat spreader used in the semiconductor device, and FIG. 2B being a sectional view thereof.

The heat spreader 20 is made of metal, and dissipates to the air, heat generated when the semiconductor element (chip) 10 is in operation. Copper (Cu) is used as the material of the heat spreader 20, and furthermore nickel (Ni) plating is performed on the surface. The heat spreader 20 has a structure including a plate-shaped principal part (plate-shaped part 20a) and a sidewall part 20b integrally formed along a periphery of the plate-shaped part 20a. The sidewall part 20b is formed in a squared-ring shape as shown in FIG. 2A. The heat spreader 20 is fixed via the sidewall part 20b onto the package 12 with a thermosetting resin 26 represented by an epoxy resin, a polyimide resin, or the like.

Meanwhile, as illustrated, tip ends of the carbon nanotubes 14 are in contact with and fixed to the inner-side surface (the side facing the chip 10 mounted on the package 12) of the plate-shaped part 20a of the heat spreader 20. This fixation is accomplished by filling and curing a resin 24 in clearances among the carbon nanotubes 14 as described later.

Moreover, a recessed portion 22 characterizing the present invention is formed in a predetermined position (i.e., a position on the periphery of a portion corresponding to a mounting area for the chip 10 on the package 12) of the plate-shaped part 20a of the heat spreader 20. A required amount of the resin 24 is stored in advance in the recessed portion 22. A thermoplastic resin (having a property to demonstrate fluidity so that the resin is softened (melted) by heating but cured by cooling) is used as the resin 24 thus stored. The thermoplastic resin 24 is heated after the heat spreader 20 is fixed to the package 12 as described later. Accordingly, the thermoplastic resin 24 needs to have a melting point higher than a curing temperature of the thermosetting resin 26 which is used to fix the heat spreader 20. Examples of the thermoplastic resin 24 used include polyolefin, polyvinyl compounds and the like.

The thermoplastic resin 24 in cooperation with the carbon nanotubes 14 functions as the thermal interface material (TIM) for the chip 10 and the heat spreader 20. The thermoplastic resin 24 flows out from the recessed portion 22 during the heating and flows into the clearance between the spreader 20 and the chip 10. By filling the clearance, the thermoplastic resin 24 brings both tip ends of the carbon nanotubes 14 into contact with the chip 10 and the heat spreader 20 (metal surface), respectively, for the fixation.

Moreover, spacers 28 made of a thermal resistant material (preferably, a metal material) are arranged at multiple positions between the package 12 and the inner-side peripheral portions of the plate-shaped part 20a of the heat spreader 20. The spacers 28 are used to adjust the clearance between the heat spreader 20 and the chip 10 on the package 12 to be an appropriate distance, prior to the heating of the thermoplastic resin 24 as described later.

A method of manufacturing the semiconductor device 30 using the thermal interface material (the carbon nanotubes 14, the thermoplastic resin 24) according to the present embodiment is described below with reference to FIGS. 2A to 3B which show an example of the manufacturing steps.

Figure 2B:
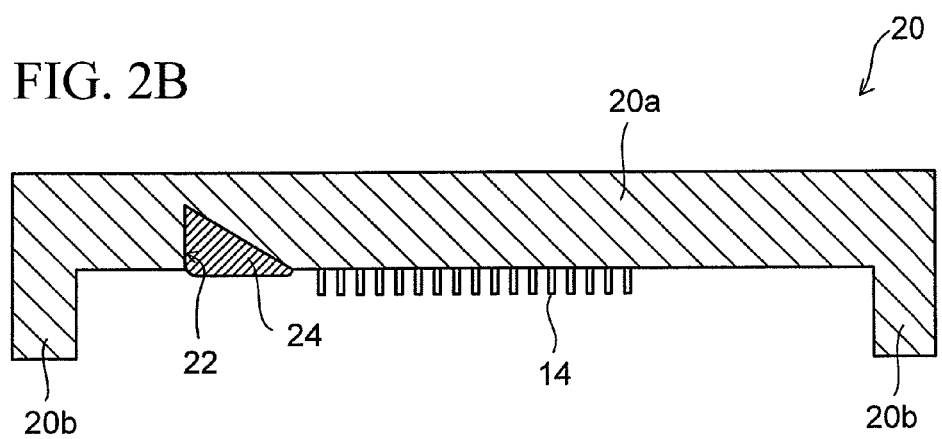

First, the heat spreader 20 is prepared, which is to be fixed to the wiring board (package) 12 on which the semiconductor element (chip) 10 is mounted. FIGS. 2A and 2B show an example thereof. FIG. 2A shows the configuration when the heat spreader 20 is seen from the top (from a side where the heat spreader 20 is eventually exposed), and FIG. 2B shows a sectional structure thereof.

In FIG. 2A, a squared portion surrounded by a broken line indicates a location (mounting area) where the chip 10 on the package 12 is to be positioned when the heat spreader 20 is fixed to the package 12 in a later step. Meanwhile, a rectangular portion surrounded by a chain line indicates a location where the recessed portion 22 is formed for storing the thermoplastic resin 24. The location where the recessed portion 22 is formed is selected to be a portion on the periphery of the mounting area for the chip 10 (the squared portion surrounded by the broken line). In the illustrated example, the recessed portion 22 is formed in a portion adjacent to one side of the mounting area for the chip 10.

Typically, copper (Cu) is used as the material of the heat spreader 20. For example, a thick copper plate having a desired size (approximately 50×50 mm) is prepared. A central portion of the copper plate is subjected to, for example, pressing, etching, or other removal process, in such a manner that the other portion along the periphery of the copper plate is left unprocessed, and that the central portion is shaped into a recessed portion having a desired depth. Thereby, formed is a structure including the plate-shaped principal part (the plate-shaped part 20a) and the sidewall part 20b integrally formed along the periphery of the plate-shaped part 20a as illustrated.

Furthermore, the recessed portion 22 is formed in a predetermined position (the rectangular portion surrounded by the chain line in FIG. 2A) of the plate-shaped part 20a by, for example, pressing, cutting, or other processes. Then, nickel (Ni) plating is performed on the resulting entire surface. In this manner, the heat spreader 20 as desired can be obtained. When the pressing process is adopted, these recessed portions (including the recessed portion 22) can be formed simultaneously.

Next, by adopting, for example, a CVD method, a large number of the carbon nanotubes 14 are formed on the surface of the plate-shaped part 20a in which the recessed portion 22 is formed. The carbon nanotubes 14 are formed to stand in the direction of heat conduction (i.e., vertically in the illustrated example).

Then, the thermoplastic resin 24 such as a polyolefin or polyvinyl compound is stored in the recessed portion 22 provided in the heat spreader 20. It is desirable that the amount of the stored resin 24 be slightly larger than a required amount. This is because, if the amount of the resin 24 is equal to or smaller than the required amount, the resin 24 may fail to fix the chip 10 and the heat spreader 20 (metal surface) in the contact state. Herein, the "required amount" means an amount required to fill the clearance between the heat spreader 20 and the chip 10.

Figure 3A:
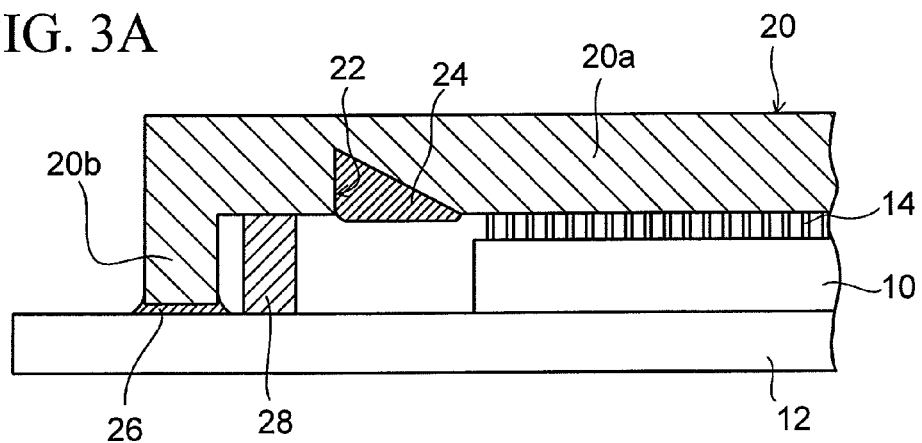
FIGS. 3A and 3B show manufacturing steps of the semiconductor device in FIGS. 1A and 1B, FIG. 3A being a sectional view showing a state where the heat spreader is fixed to a wiring board on which the semiconductor element is mounted, the semiconductor element being provided with carbon nanotubes (the thermal interface material), and FIG. 3B being a sectional view showing a state where a resin (the thermal interface material) is filled into a clearance between the semiconductor element and the heat spreader.

Next, as shown in FIG. 3A, the semiconductor element (chip) 10 is mounted on the wiring board (package) 12 with the face surface (the surface on the side where circuits are formed) facing downward.

Then, the surface of the package 12 on which the chip 10 is mounted is faced to the surface of the heat spreader 20 in which the recessed portion 22 is formed. Thus, the tip ends of the carbon nanotubes 14 on the heat spreader 20 are brought into contact with the surface of the chip 10. In this event, the spacers (made of a thermal resistant material such as a metal, and having a desired thickness (height)) 28 are interposed between the heat spreader 20 and the package 12. The spacers 28 adjust the clearance between the heat spreader 20 and the chip 10 on the package 12 to be an appropriate distance.

Furthermore, the fixation resin (thermosetting resin such as an epoxy resin or a polyimide resin) 26 is used to fix the heat spreader 20 (sidewall part 20b) onto the package 12. Accordingly, the appropriate clearance is fixed between the chip 10 and the heat spreader 20.

Note that, although not particularly illustrated, a lower surface (the surface to which the package 12 is bonded) of the sidewall part 20b of the heat spreader 20 is partially opened. Such opening is made because, if the lower surface of the sidewall part 20b of the heat spreader 20 is air-tightly sealed with the surface of the package 12, no air can escape during the pressing when the fixation resin 26 is melted for fixation of the heat spreader 20; hence, the heat spreader 20 and the package 12 cannot be bonded together reliably with the resin 26.

Figure 3B:
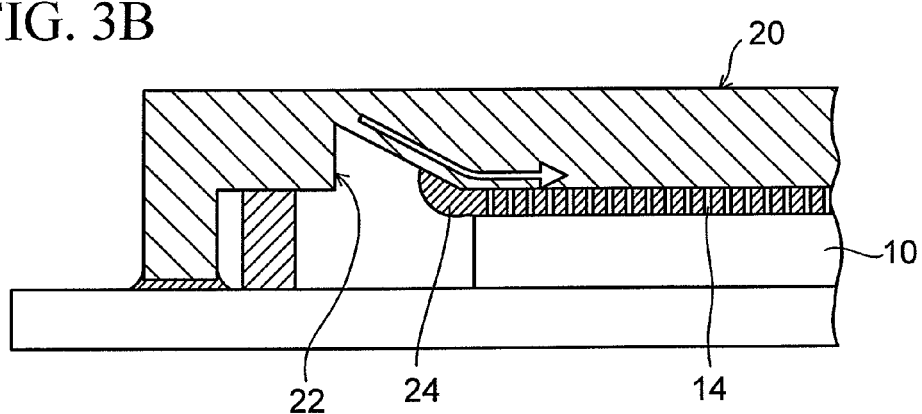

Next, while the clearance is fixed appropriately between the heat spreader 20 and the chip 10 on the package 12 as shown in FIG. 3B, the resultant structure is heated at a temperature at which the thermoplastic resin 24 stored in the recessed portion 22 is softened. Thereby, the thermoplastic resin 24 is softened (melted), and the melted resin is fluidized in a direction indicated by the arrow in the drawing. Then, the resin flows into the clearance between the chip 10 and the heat spreader 20 by capillary action, filling the clearances among the carbon nanotubes 14 on the chip 10.

When no resin 24 is stored in the recessed portion 22 any more, the clearance between the chip 10 and the heat spreader 20 is sufficiently filled with the resin 24. Then, the resin 24 is cured by cooling. Thereby, the cured resin 24 fixes the tip ends of the carbon nanotubes 14 and the surface of the chip 10 in the contact state, and functions as the thermal interface material (TIM) in cooperation with the carbon nanotubes 14.

Incidentally, during the heating of the thermoplastic resin 24, if the package 12 and the heat spreader 20 are held standing with the side including the recessed portion 22 up, the filling with the resin 24 can be completed quickly.

In the above-described manufacturing steps, the description is given by taking the example where the carbon nanotubes 14 are grown on the heat spreader 20. However, the carbon nanotubes 14 can be formed by adopting other methods. For example, the carbon nanotubes 14 formed on a support (temporary substrate) made of a silicon substrate or a glass substrate in advance may be transferred to the surface of the heat spreader 20 or the chip 10.

As described above, in the method of manufacturing the semiconductor device 30 using the thermal interface material (TIM) according to the present embodiment, the heat spreader 20 is fixed to the package 12 with an appropriate clearance kept between the heat spreader 20 and the semiconductor element (chip) 10 mounted on the package 12. Then, heating to the softening point is performed on the thermoplastic resin (thermal interface material) 24 stored in the recessed portion 22 provided in the predetermined position in the heat spreader 20. Subsequently, the resin 24 melted by the heating is flowed into the clearance between the heat spreader 20 and the chip 10, filling the clearances among a large number of the carbon nanotubes 14.

Figure 5A:
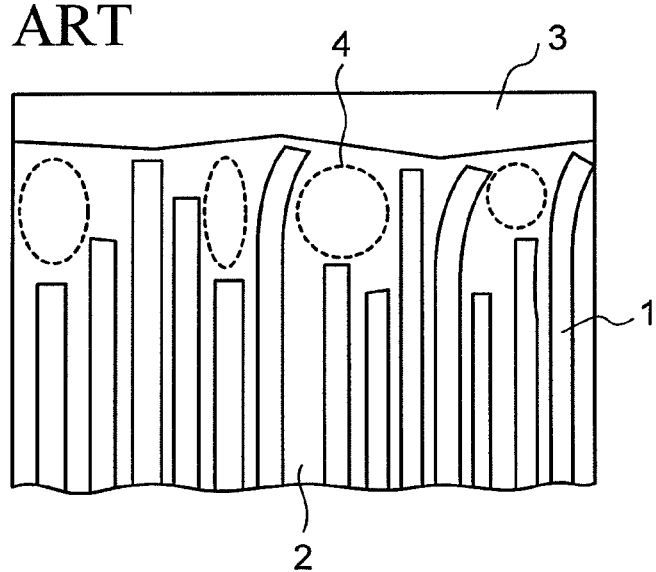
FIGS. 5A and 5B are views for explaining problems in the prior art when carbon nanotubes are used as a thermal interface material.
Figure 5B:
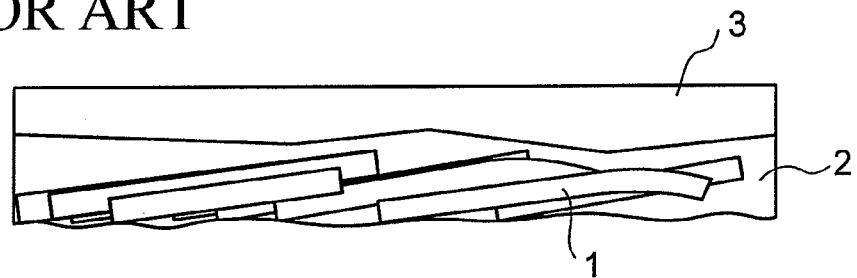

Namely, after an appropriate clearance is secured between the chip 10 and the heat spreader 20, the thermal interface material (thermoplastic resin 24) is filled into the clearance. Accordingly, when the resin 24 is filled therein, the contact state between the tip ends of the carbon nanotubes 14 and the metal surface of the heat spreader 20 is ensured. This enables eliminating a problem of an increased thermal resistance such as encountered in the prior art (FIGS. 5A and 5B) at the portion of the resin layer 2 interposed between the tip ends of the carbon nanotubes 1 and the surface of the heat spreader 3. Thus, the favorable thermal conductivity of the thermal interface material (the carbon nanotubes 14 and the thermoplastic resin 24) is ensured between the chip 10 and the heat spreader 20.

Moreover, after an appropriate clearance is secured between the chip 10 and the heat spreader 20, the thermal interface material (the thermoplastic resin 24) is filled in the clearance. Accordingly, it is no longer necessary to perform a pressing treatment such as performed in the prior art during the fixation of the heat spreader 3. As a result, the problem such as exemplified in FIG. 5B (i.e., the carbon nanotubes 1 lie down and may not be recovered to the original arrangement) does not occur.

In this manner, the thermal interface material (the carbon nanotube 14 and the thermoplastic resin 24) used in this embodiment is capable of flexibly following a deformation (warpage) due to heat generated when the chip 10 is in operation. Namely, the thermal interface material is capable of keeping the thermal resistance to the minimum at the thermally coupled portions of the heat spreader 20 and the chip 10. This greatly contributes to stable thermal coupling between the chip 10 and the heat spreader 20.

In the above-described embodiment, the description is given by taking the example where the recessed portion 22 is provided in one predetermined position in the heat spreader 20 (see FIGS. 2A and 2B). However, it is of course that the position where such a recessed portion is provided is not limited thereto.

Figure 4A:
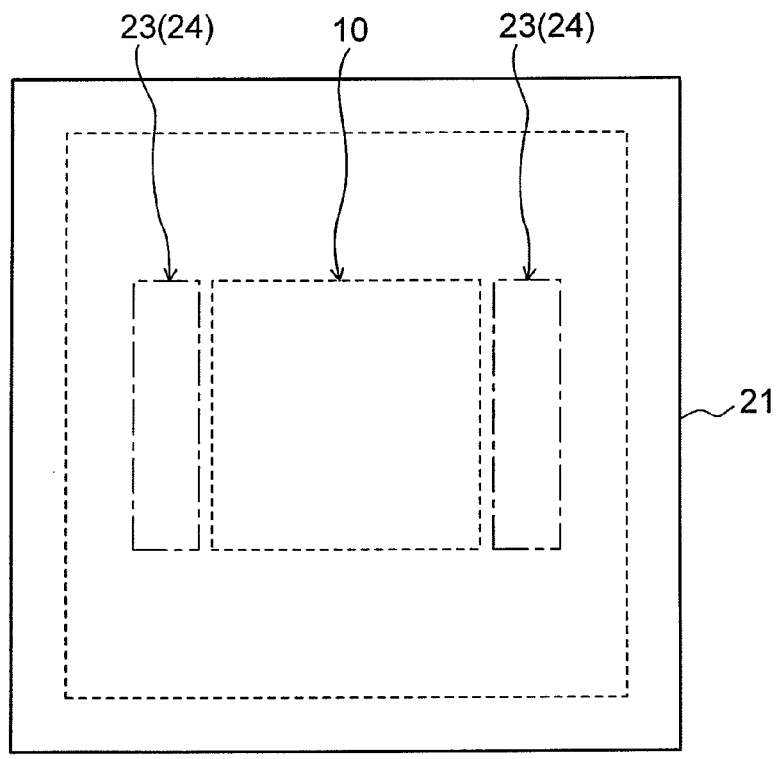
FIGS. 4A and 4B show another configuration example of the heat spreader used in the semiconductor device in FIGS. 1A and 1B, FIG. 4A being a top view thereof, and FIG. 4B being a sectional view thereof.
Figure 4B:
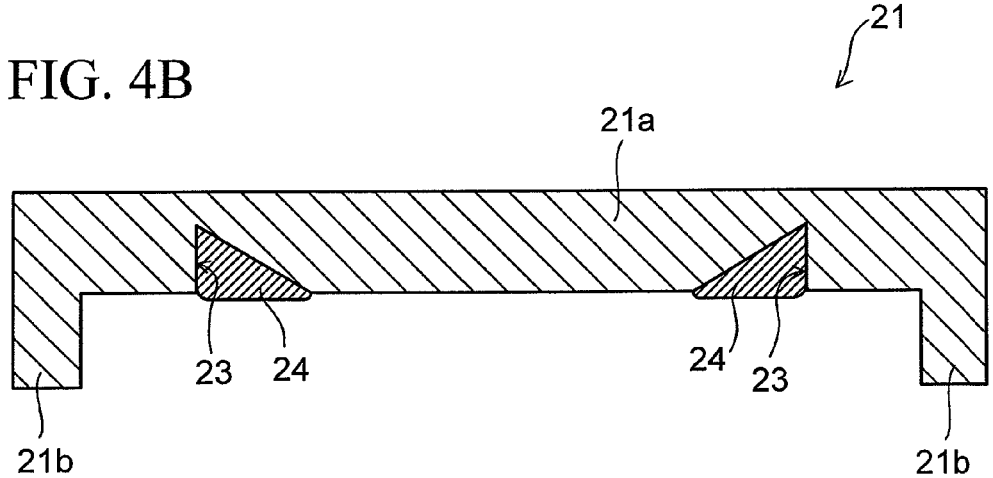

FIGS. 4A and 4B show one example thereof, and show another configuration example (a heat spreader 21) of the heat spreader 20 used in the semiconductor device 30 in FIGS. 1A and 1B. FIG. 4A shows the configuration when the heat spreader 21 is seen from the top (from a side where the heat spreader 21 is eventually exposed). FIG. 4B shows a sectional structure thereof.

The heat spreader 21 of this embodiment is different from the heat spreader 20 (see FIGS. 2A and 2B) of the above-described embodiment. Specifically, when the heat spreader 21 is fixed to the package 12, recessed portions 23 are formed respectively at two sides of the location (mounting area) where the chip 10 on the package 12 is positioned in such a manner that the recessed portions 23 sandwich the mounting area therebetween. Similarly to the heat spreader 20, the heat spreader 21 includes a plate-shaped part 21a having a plate-shaped principal part and a sidewall part 21b integrally formed along the periphery of the plate-shaped part 21a. Since other structural components are the same as those in the above-described embodiment, description thereof is omitted.

According to this embodiment, the thermoplastic resin 24 is supplied and filled into the clearance between the semiconductor element (chip) 10 and the heat spreader 20 from each of the recessed portions 23 respectively at the two sides of the chip 10. Accordingly, the filling with the resin 24 can be completed quickly as in the case of the above-described embodiment even though the package 12 and the heat spreader 20 are not held standing with the side including the recessed portion 22 up when the resin is filled (FIG. 3B).

Moreover, in the above-described embodiment, the description is given by taking the example where the carbon nanotubes 14 provided on the chip 10 and the thermoplastic resin 24 supplied from the recessed portion 22 of the heat spreader 20 are used in combination as the thermal interface material interposed between the chip 10 and the heat spreader 20. However, of course, it should be understood that the form of the thermal interface material is not limited thereto as is also apparent from the gist of the present invention (after an appropriate clearance is fixed between an electronic component and a heat-spreading component, a thermal interface material stored in a recessed portion provided in a predetermined position in the heat-spreading component is softened (melted) into the fluidized state and flowed and filled into the clearance). In brief, any material can be used as the thermal interface material as long as the material has a high thermal conductivity. For example, it is also technologically feasible to use indium (In).

Where indium (In) is used as the thermal interface material, gold (Au) plating is further performed on the recessed portion(s) 22 or 23 provided in the heat spreader 20 or 21 (Ni plating is performed on the Cu substrate) of the above-described embodiment. The Au plating layer is formed to adhere indium to and hold in the recessed portion(s) 22 or 23. Additionally, the Ni plating layer plays a role in enhancing the adhesion between the substrate (Cu) and the Au layer, and preventing Cu from diffusing into the Au layer.

In this case too, it is desirable that the amount of indium to be adhered to and held in the recessed portion(s) 22 or 23 in advance is slightly larger than a required amount. Note that the "required amount" herein refers to an amount required to fill the clearance between the heat spreader 20 or 21 and the chip 10.

What is claimed is:

1. A method of manufacturing an electronic component device which includes an electronic component mounted on a wiring board, and a heat-spreading component having a plate-shaped principal part and being coupled via a thermal interface material to the electronic component, the method comprising:

forming a recessed portion, in the plate-shaped part of the heat-spreading component, only at a position on a periphery of a portion thereof corresponding to an area for the electronic component, and storing a thermoplastic resin serving as the thermal interface material in the recessed portion;

arranging a large number of filamentous thermo-conductive elements serving as the thermal interface material, so as to stand side by side on a surface of the heat-spreading component in which the recessed portion is formed, or on an exposed surface of the electronic component;

fixing the heat-spreading component to the wiring board in such a manner that a surface of the wiring board on which the electronic component is mounted is faced to the surface of the heat-spreading component in which the recessed portion is formed, and that a clearance is adjusted between the electronic component and the heat-spreading component; and after said fixing, heating the thermoplastic resin to a softening point thereof into a fluidized state, and causing the resin to flow into the clearance between the electronic component and the heat-spreading component to thereby fill the clearance.

2. The method according to claim 1, wherein the filamentous thermo-conductive elements are carbon nanotubes.

3. The method according to claim 2, wherein when fixing the heat-spreading component to the wiring board, the heat-spreading component is bonded to the wiring board using a thermosetting resin having a melting point lower than the softening point of the thermoplastic resin while the clearance between the electronic component and the heat-spreading component is adjusted with a spacer having a desired thickness interposed therebetween.

4. The method according to claim 3, wherein the electronic component is a squared semiconductor chip when seen in a plan view, and the recessed portion is formed, in the plate-shaped part of the heat-spreading component, at each of two positions opposite to each other on the periphery of the portion corresponding to the area for the semiconductor chip.

* * * * *